(12) United States Patent
Otsuki

(10) Patent No.: US 10,615,140 B2
(45) Date of Patent: Apr. 7, 2020

(54) SEMICONDUCTOR DEVICE SUPPRESSING AN INCLINATION OF A SEMICONDUCTOR ELEMENT AFTER SOLDER BONDING

(71) Applicant: Mitsubishi Electric Corporation, Tokyo (JP)

(72) Inventor: Takami Otsuki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/112,818

(22) Filed: Aug. 27, 2018

(65) Prior Publication Data

US 2019/0123011 A1 Apr. 25, 2019

(30) Foreign Application Priority Data

Oct. 24, 2017 (JP) .................................. 2017-205037

(51) Int. Cl.
*H01L 23/00* (2006.01)
*H01L 23/488* (2006.01)
*H01L 23/367* (2006.01)

(52) U.S. Cl.
CPC ............ *H01L 24/32* (2013.01); *H01L 23/367* (2013.01); *H01L 23/488* (2013.01); *H01L 24/05* (2013.01); *H01L 2224/26175* (2013.01); *H01L 2224/32227* (2013.01); *H01L 2924/10272* (2013.01)

(58) Field of Classification Search
CPC combination set(s) only.
See application file for complete search history.

(56) References Cited

U.S. PATENT DOCUMENTS

| 9,520,374 B2* | 12/2016 | Kasuya | H01L 24/09 |
| 2008/0150163 A1* | 6/2008 | Ohse | H01L 23/49513 |
| | | | 257/783 |
| 2017/0084511 A1* | 3/2017 | Lee | H01L 23/13 |

FOREIGN PATENT DOCUMENTS

| JP | 2006-049777 A | | 2/2006 | |
| JP | 2006049777 A | * | 2/2006 | ............. H01L 24/48 |

* cited by examiner

*Primary Examiner* — Andrew Q Tran
(74) *Attorney, Agent, or Firm* — Studebaker & Brackett PC

(57) ABSTRACT

A semiconductor device according to the present invention includes a resist provided so as to have an opening on a metal pattern, the resist having a protrusion part protruding into the opening, and the semiconductor device further includes a semiconductor element having an outside dimension smaller than an outside dimension of the opening excluding the protrusion, and solder provided inside the opening to join the metal pattern and the semiconductor element, wherein the protrusion part of the resist includes a plurality of protrusions that overlap with the semiconductor element in a plan view and regulate a thickness direction of the semiconductor element.

6 Claims, 3 Drawing Sheets

SEMICONDUCTOR DEVICE SUPPRESSING AN INCLINATION OF A SEMICONDUCTOR ELEMENT AFTER SOLDER BONDING

BACKGROUND OF THE INVENTION

Field of the Invention

The present invention relates to a semiconductor device having a structure in which a metal pattern and a semiconductor element are joined by solder.

Description of the Background Art

Conventionally, a semiconductor device having a structure in which a metal pattern and a semiconductor element are joined by solder has been known. In the semiconductor device, when the solder provided directly below the semiconductor element melts, a thickness of the solder cannot be kept uniform, and there is a problem that the semiconductor element after bonding may be tilted.

As a countermeasure against such a problem, there has been proposed a method in which a wire bond is provided in advance at a place where a semiconductor element is arranged to ensure a thickness corresponding to a diameter of the wire bond. Further, a semiconductor device including a resist provided so as to surround the solder has been disclosed (see, for example, Japanese Patent Application Laid-Open No. 2006-49777).

However, in the method of securing the thickness corresponding to the diameter of the wire bond, it is necessary to add a process of providing the wire bond, which causes problems such as a long production time and high production costs. In addition, in Japanese Patent Application Laid-Open No. 2006-49777, inclination of a semiconductor element cannot be suppressed.

SUMMARY

The present invention has been made to solve such problems, and an object thereof is to provide a semiconductor device capable of suppressing inclination of a semiconductor element.

In order to solve the above problem, a semiconductor device according to the present invention includes a resist provided so as to have an opening on a metal pattern, the resist having a protrusion part protruding into the opening, and the semiconductor device further includes a semiconductor element having an outside dimension smaller than an outside dimension of the opening excluding the protrusion, and solder that is provided in the opening to join the metal pattern and the semiconductor element, wherein the protrusion part of the resist includes a plurality of protrusions that overlap with the semiconductor element in a plan view and regulate a thickness direction of the semiconductor element.

An object of the present invention is to provide a semiconductor device capable of suppressing inclination of a semiconductor element. A semiconductor device according to the present invention includes a resist provided so as to have an opening on a metal pattern, the resist having a protrusion part protruding into the opening, and the semiconductor device further includes a semiconductor element having an outside dimension smaller than an outside dimension of the opening excluding the protrusion, and solder that is provided in the opening to join the metal pattern and the semiconductor element, wherein the protrusion part of the resist includes a plurality of protrusions that overlap with the semiconductor element in a plan view and regulate a thickness direction of the semiconductor element.

These and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described below with reference to the drawings.

First Preferred Embodiment

Figure 1:
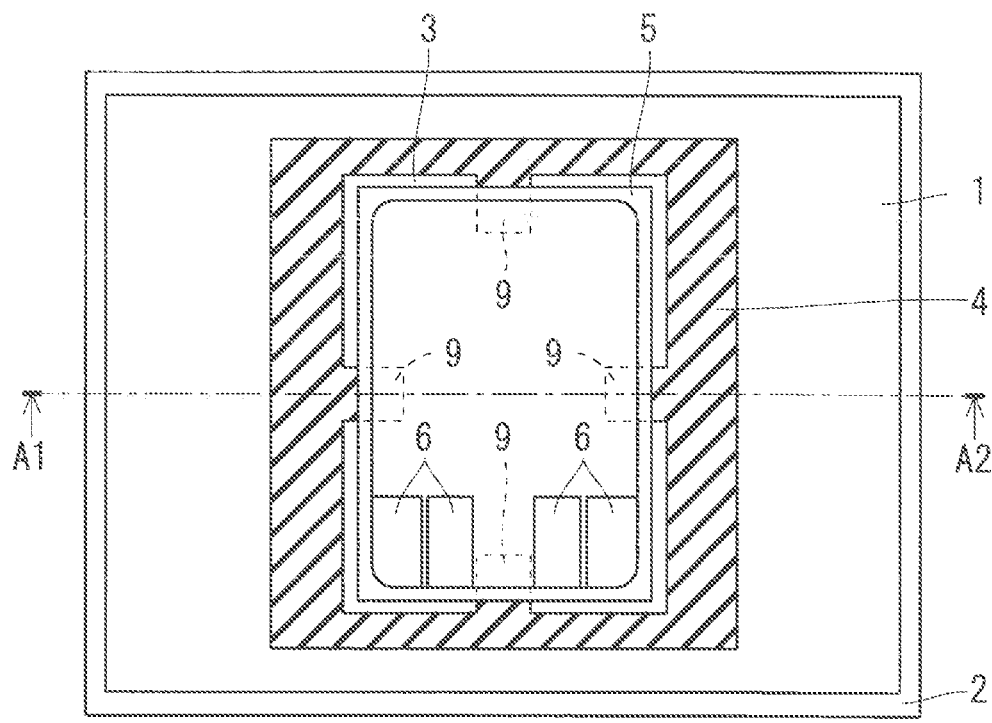
FIG. 1 is a plan view showing an example of a configuration of a semiconductor device according to a first preferred embodiment of the present invention.
Figure 2:
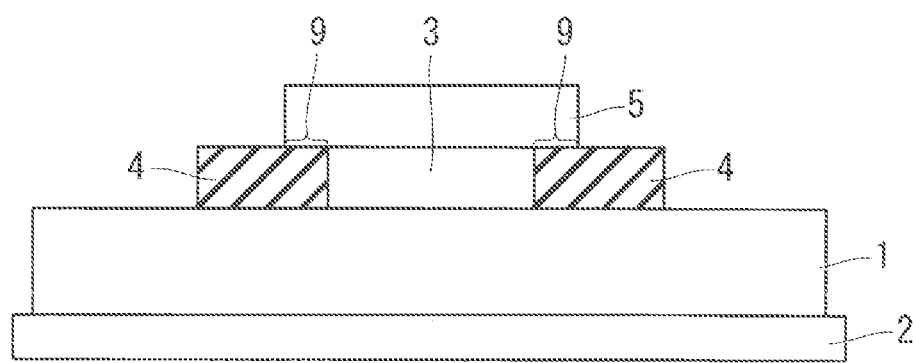
FIG. 2 is a sectional view showing an example of the configuration of the semiconductor device according to the first preferred embodiment of the present invention.

FIG. 1 is a plan view showing an example of a configuration of a semiconductor device according to a first preferred embodiment of the present invention. FIG. 2 is a sectional view of A1-A2 in FIG. 1.

As shown in FIGS. 1 and 2, a metal pattern 1 is provided on an insulating layer 2. A resist 4 having a quadrangular opening is provided on the metal pattern 1. The thickness of the resist 4 is, for example, 50 μm or less. A semiconductor element 5 has four control electrode pads 6 on a surface to be joined with solder 3. An outside dimension of the semiconductor element 5 is smaller than an outside dimension of an opening of the resist 4 excluding a protrusion 9.

The solder 3 is provided in the opening of the resist 4 and joins the metal pattern 1 and the semiconductor element 5. In other words, the resist 4 is provided around the solder 3, which is provided directly below the semiconductor element 5, so as to suppress spreading of wetting of the solder 3.

The resist 4 has a plurality of protrusions 9 protruding into the opening. More specifically, the resist 4 has one protrusion 9 on each side of the opening. Each protrusion 9 overlaps with the semiconductor element 5 in a plan view and regulates a thickness direction of the semiconductor element 5.

In the examples of FIGS. 1 and 2, a case where the resist 4 has one protrusion 9 on each side of the opening is shown, but the first preferred embodiment is not limited to such a case. The resist 4 may have at least one protrusion 9 on each side of the opening.

Each protrusion 9 of the resist 4 and the semiconductor element 5 may be in direct contact with each other or may be in contact via the solder 3. The number of the control electrode pads 6 is not limited to four and at least one control electrode pad 6 may be provided.

According to the first preferred embodiment, as described above, the protrusion 9 of the resist 4 overlaps with the semiconductor element 5 in a plan view and regulates the thickness direction of the semiconductor element 5, and therefore, a distance by which the semiconductor element 5 sinks into the solder 3 can be limited. That is, the distance in the thickness direction between the metal pattern 1 and the semiconductor element 5 can be ensured for the thickness of the resist 4, and therefore the inclination of the semiconductor element 5 can be suppressed. In addition, the thickness of the solder 3 directly below the semiconductor element 5 is uniform, and therefore deterioration of local heat dissipation properties when heat generated in the semiconductor element 5 is dissipated can be suppressed, and the local crack propagation in the solder 3 due to long-term use and the like can also be suppressed.

Note that semiconductor elements with small outside dimensions such as semiconductor elements using SiC may have a large inclination, and therefore, the above configuration is more effective in semiconductor devices including such semiconductor elements.

Second Preferred Embodiment

Figure 3:
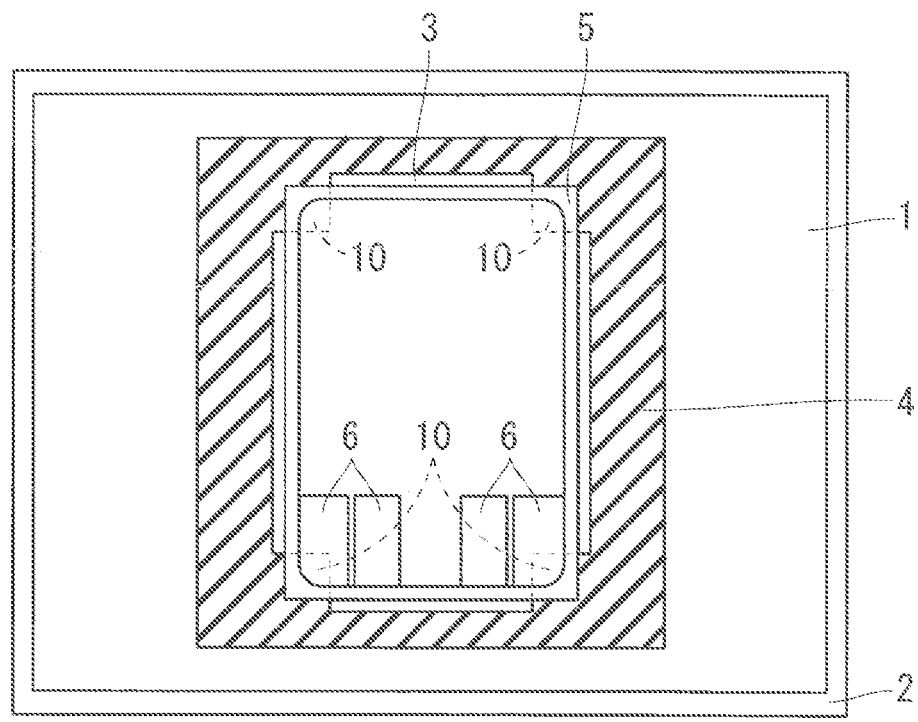
FIG. 3 is a plan view showing an example of a configuration of a semiconductor device according to a second preferred embodiment of the present invention.

FIG. 3 is a plan view showing an example of a configuration of a semiconductor device according to a second preferred embodiment of the present invention.

As shown in FIG. 3, in the semiconductor device according to the second preferred embodiment, the resist 4 has protrusions 10 at each of the four corners of the opening. The other configurations are the same as those in the first preferred embodiment, and thus the description thereof is omitted herein.

In the example of FIG. 3, a case where the resist 4 has protrusions 10 at each of the four corners of the opening is shown, but the second preferred embodiment is not limited to such a case. The resist 4 may have protrusions 10 at each of at least two corners of the opening.

From the above, according to the second preferred embodiment, the same effects as those of the first preferred embodiment can be obtained. In addition, the resist 4 has protrusions 10 at each of at least two corners of the opening, and thus the resist 4 has a structure in which heat generated in the semiconductor element 5 is easily dissipated. That is, the semiconductor device according to the second preferred embodiment has a structure with better heat dissipation performance as compared to the semiconductor device according to the first preferred embodiment.

In the above description, the structure of the semiconductor device in which the resist 4 has protrusions 10 at each of at least two corners of the opening has been described, but the second preferred embodiment is not limited to such an example. The structure of the semiconductor device according to the second preferred embodiment may be, for example, a structure arbitrarily combining the structure of the semiconductor device according to the first preferred embodiment shown in FIGS. 1 and 2 and the structure of the semiconductor device according to the second preferred embodiment shown in FIG. 3.

Third Preferred Embodiment

Figure 4:
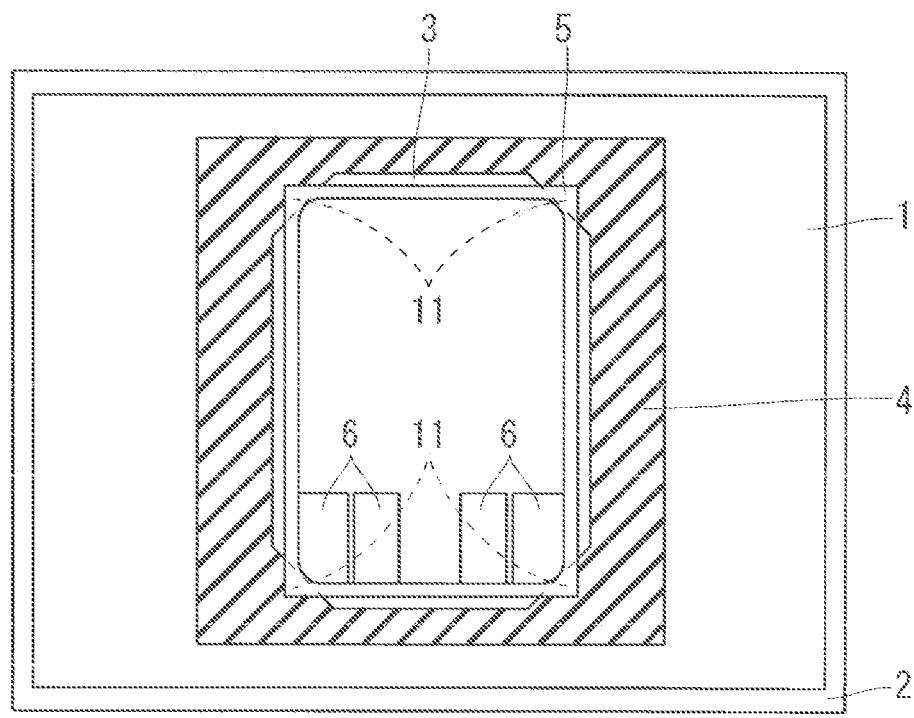
FIG. 4 is a plan view showing an example of a configuration of a semiconductor device according to a third preferred embodiment of the present invention.

FIG. 4 is a plan view showing an example of a configuration of a semiconductor device according to a third preferred embodiment of the present invention.

As shown in FIG. 4, in the semiconductor device according to the third preferred embodiment, the protrusion 11 of the resist 4 has a shape formed by chamfering an inner corner of the opening. The other configurations are the same as those of the second preferred embodiment, and thus the description thereof is omitted herein.

From the above, according to the third preferred embodiment, effects similar to those of the first preferred embodiment can be obtained. In addition, since the protrusion 11 of the resist 4 has a shape formed by chamfering the inner corner of the opening, an overlapping area of the protrusion 11 and the semiconductor element 5 in a plan view becomes small. Accordingly, the semiconductor device according to the third preferred embodiment has a structure with better heat dissipation performance as compared to the semiconductor device according to the second preferred embodiment.

Fourth Preferred Embodiment

Figure 5:
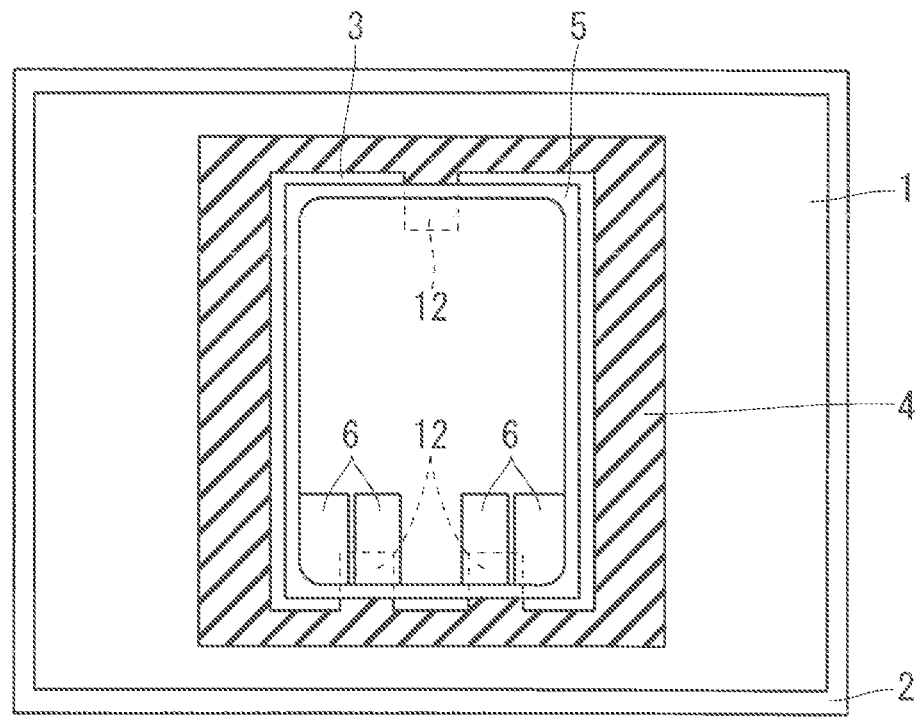
FIG. 5 is a plan view showing an example of a configuration of a semiconductor device according to a fourth preferred embodiment of the present invention.

FIG. 5 is a plan view showing an example of a configuration of a semiconductor device according to a fourth preferred embodiment of the present invention.

As shown in FIG. 5, in the semiconductor device according to the fourth preferred embodiment, the resist 4 has a protrusion 12 overlapping at least with the control electrode pad 6 in a plan view. The other configurations are the same as those in the first preferred embodiment, and thus the description thereof is omitted herein.

In the example of FIG. 5, a case where the resist 4 has two protrusions 12 overlapping with the control electrode pad 6 in a plan view is shown, but the fourth preferred embodiment is not limited to such a case. At least one protrusion 12 overlapping with the control electrode pad 6 in a plan view may be provided.

From the above, according to the fourth preferred embodiment, the same effects as those of the first preferred embodiment can be obtained. Further, since the resist 4 has the protrusion 12 overlapping with the control electrode pad 6 which generates little heat during operation of the semiconductor element 5, the resist 4 has a structure in which the heat generated in the semiconductor element 5 is easily dissipated. That is, the semiconductor device according to the fourth preferred embodiment has a structure with better heat dissipation performance as compared to the semiconductor device according to the first to third preferred embodiments.

In the above description, the structure of the semiconductor device in which the resist 4 has at least the protrusion 12 overlapping with the control electrode pad 6 in a plan view has been described, but the fourth preferred embodiment is not limited to such an example. The structure of the semiconductor device according to the fourth preferred embodiment may be, for example, a structure arbitrarily combining the structure of the semiconductor device according to the first preferred embodiment shown in FIGS. 1 and 2, the structure of the semiconductor device according to the second preferred embodiment shown in FIG. 3, and the structure of the semiconductor device according to the third preferred embodiment shown in FIG. 4.

Fifth Preferred Embodiment

Figure 6:
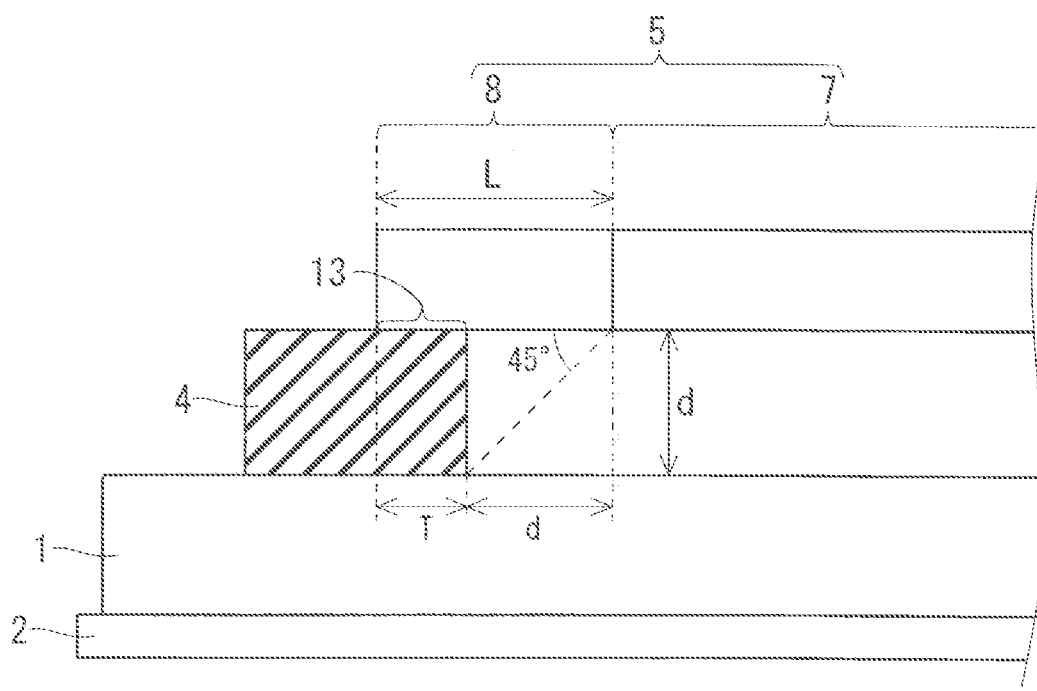
FIG. 6 is a sectional view showing an example of a configuration of a semiconductor device according to a fifth preferred embodiment of the present invention.

FIG. 6 is a sectional view showing an example of a configuration of a semiconductor device according to a fifth preferred embodiment of the present invention.

As shown in FIG. 6, the semiconductor element 5 has a heat generation region 7 and a non-heat generation region 8 surrounding the heat generation region 7 in a plan view. The resist 4 has protrusions 13 overlapping with the non-heat generation region 8 of the semiconductor element 5 in a plan view. The other configurations are the same as those in the first preferred embodiment, and thus the description thereof is omitted herein.

In a direction in which the protrusion 13 of the resist 4 protrudes, a distance T over which the protrusion 13 and the non-heat generation region 8 overlap with each other in a plan view is shorter than a distance L of the non-heat generation region 8. In particular, if the heat generated in the heat generation region 7 is assumed to spread from the heat generation region 7 at an angle of 45°, the distance T over which the protrusion 13 and the non-heat generation region 8 overlap with each other in a plan view satisfies the relationship of $0<T\leq L-d$. Here, d is the thickness of the solder 3 directly below the semiconductor element 5.

From the above, according to the fifth preferred embodiment, the same effects as those of the first preferred embodiment can be obtained. Further, by restricting the distance in which the protrusion 13 and the non-heat generation region 8 overlap with each other in a plan view in the direction in which the protrusion 13 of the resist 4 protrudes, a structure in which the heat generated in the semiconductor element 5 is easily dissipated is obtained. That is, the semiconductor device according to the fifth preferred embodiment has a structure with better heat dissipation performance as compared to the semiconductor device according to the first to fourth preferred embodiments.

In the above, the description has been provided based on the first preferred embodiment, but the fifth preferred embodiment is not limited to such a description. The structure of the semiconductor device according to the fifth preferred embodiment may be, for example, a structure arbitrarily combining the structure of the semiconductor device according to the first preferred embodiment shown in FIGS. 1 and 2, the structure of the semiconductor device according to the second preferred embodiment shown in FIG. 3, the structure of the semiconductor device according to the third preferred embodiment shown in FIG. 4, and the structure of the semiconductor device according to the fourth preferred embodiment shown in FIG. 5.

It should be noted that in the present invention, each preferred embodiment can freely be combined or each preferred embodiment can be modified or omitted as appropriate within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
a resist provided on a metal pattern, the resist having an opening on the metal pattern and including a plurality of protrusions that protrude into the opening,
the semiconductor device further comprising:
a semiconductor element having an outside dimension smaller than an outside dimension of the opening excluding the protrusions; and
solder provided inside the opening to join the metal pattern and the semiconductor element,
wherein the protrusions overlap with the semiconductor element in a plan view and regulate a position of the semiconductor element relative to the resist in a thickness direction, and
at least one of the protrusions directly contacts the semiconductor element.

2. The semiconductor device according to claim 1, wherein
the opening has a quadrangular shape, and
at least one of the protrusions is disposed on each side of the opening.

3. The semiconductor device according to claim 1, wherein
the opening has a quadrangular shape, and
at least one of the protrusions is disposed at each of at least two corners of the opening.

4. The semiconductor device according to claim 3, wherein at least one of the protrusions has a shape formed by chamfering an inner corner of the opening.

5. The semiconductor device according to claim 1, wherein
the semiconductor element has at least one control electrode pad on a surface to be joined with the solder, and
at least one of the protrusions overlaps with the control electrode pad in the plan view.

6. The semiconductor device according to claim 1, wherein
the semiconductor element has a heat generation region and a non-heat generation region surrounding the heat generation region,
at least one of the protrusions overlaps with the non-heat generation region in the plan view, and
in a direction in which the at least one protrusion that overlaps with the non-heat generation region in the plan view protrudes, a distance over which the at least one protrusion that overlaps with the non-heat generation region in the plan view and the non-heat generation region overlap with each other in the plan view is shorter than a distance of the non-heat generation region.

* * * * *